United States Patent
Wagner

(10) Patent No.: US 7,894,785 B2
(45) Date of Patent: Feb. 22, 2011

(54) AMPLIFIER ASSEMBLY, RECEIVER COMPRISING SAID ASSEMBLY AND METHOD FOR OPERATING A PROGRAMMABLE AMPLIFIER

(75) Inventor: Elmar Wagner, Duisburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/777,721

(22) Filed: May 11, 2010

(65) Prior Publication Data

US 2010/0216418 A1 Aug. 26, 2010

Related U.S. Application Data

(63) Continuation of application No. 11/132,517, filed on May 19, 2005, now Pat. No. 7,734,267, which is a continuation of application No. PCT/DE03/03895, filed on Nov. 25, 2003.

(30) Foreign Application Priority Data

Nov. 28, 2002 (DE) ................ 10 255 606

(51) Int. Cl.
*H04B 1/06* (2006.01)
(52) U.S. Cl. .............. 455/240.1; 455/334; 455/341; 375/345

(58) Field of Classification Search .............. 455/232.1, 455/234.1, 240.1, 250.1, 323, 334, 340, 341; 375/345
See application file for complete search history.

(56) References Cited

U.S. PATENT DOCUMENTS

| 7,369,826 | B2 * | 5/2008 | Wildhagen | 455/179.1 |
| 7,536,208 | B2 * | 5/2009 | Dick et al. | 455/574 |
| 7,583,760 | B2 * | 9/2009 | Bernhardsson et al. | 375/340 |
| 2004/0137859 | A1 * | 7/2004 | Muto | 455/126 |
| 2005/0003783 | A1 * | 1/2005 | Ben-Ayun et al. | 455/232.1 |
| 2005/0135515 | A1 * | 6/2005 | Yang et al. | 375/345 |

* cited by examiner

*Primary Examiner*—Nhan Le
(74) *Attorney, Agent, or Firm*—SpryIP, LLC

(57) ABSTRACT

An amplifier assembly and also a receiver including such an amplifier assembly is disclosed, wherein the amplifier includes a programming input for setting the gain thereof. The signal level at the output of the amplifier is compared with a reference level and a counter is incremented in a step-by-step fashion such that the gain in the amplifier is reduced for as long as the output level lies above the reference level. The amplifier assembly enables frequency-dependent received field strength fluctuations that occur in frequency hopping methods to be corrected in a manner dependent on the conditions in the current time slot. The assembly is also suitable for modulation methods that use a modulation with phase and amplitude variation.

7 Claims, 1 Drawing Sheet

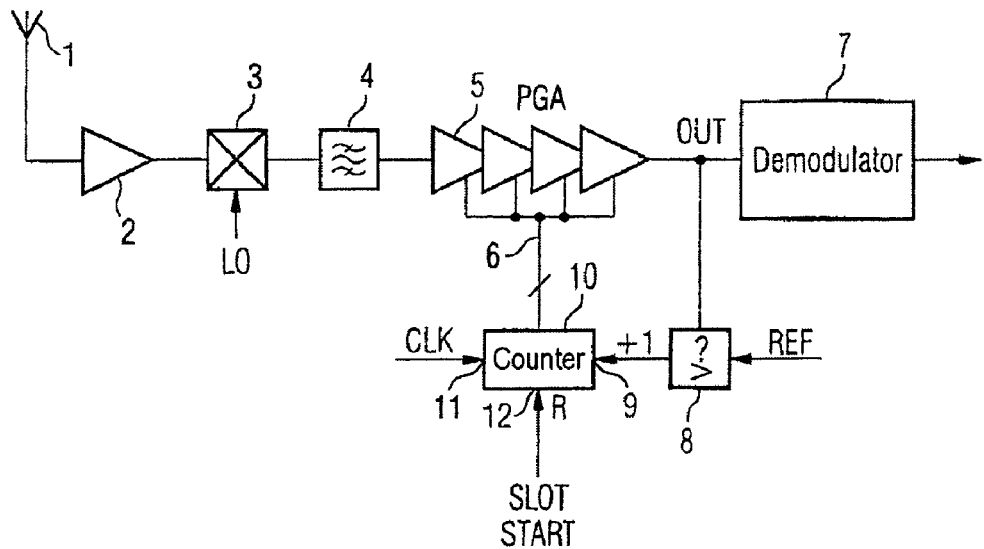
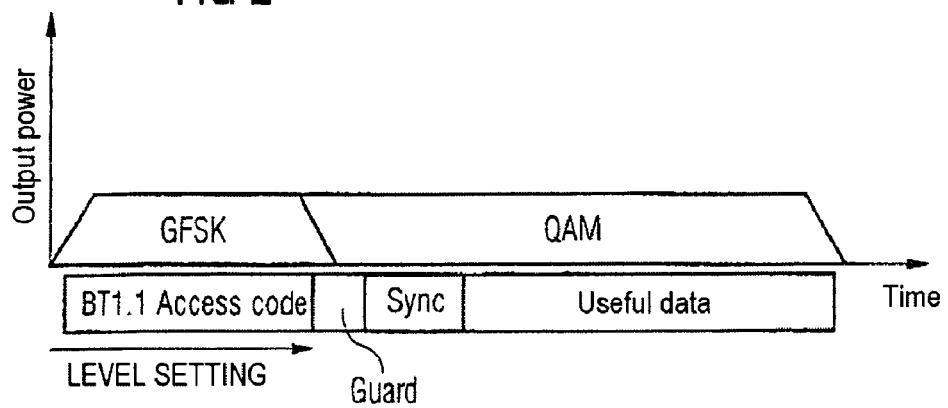

AMPLIFIER ASSEMBLY, RECEIVER COMPRISING SAID ASSEMBLY AND METHOD FOR OPERATING A PROGRAMMABLE AMPLIFIER

RELATED CASES

This Application is a Divisional Application of co-pending application Ser. No. 11/132,517, which was filed on May 19, 2005. The priority of the application is hereby claimed and the contents thereof incorporated herein by reference. The co-pending application is a continuation of PCT/DE03/03895, which was not published in English, which claims the benefit of the priority date of German Patent Application No. DE 102 55 606.7, filed on Nov. 28, 2002, the contents of which both are herein incorporated by reference in their entireties.

BACKGROUND

Various digital modulation methods are known in which the phase angle, the frequency, the amplitude of a carrier signal or combinations thereof are varied in a manner dependent on useful data to be transmitted.

In the case of the widespread mobile radio standard GSM, Global System for Mobile Communication, the modulation method used is GSMK, Gaussian Minimum Shift Keying. This involves a phase-continuous frequency shift keying method with a modulation index of 0.5, in which Gaussian pulses are used instead of rectangular pulses for the data.

In order to meet the demand for the transmission of ever higher volumes of data, combined phase and amplitude keyings are increasingly being used instead of frequency shift keying methods. In the case of said combined phase and amplitude keyings, part of the signal information is contained in the signal amplitude. It is necessary in this case to use amplifiers that satisfy high linearity requirements. However, the gain of these amplifiers has to be regulated in a manner dependent on the received field strength in order to provide for constant amplitude conditions at the receiver output in order that the data can be demodulated optimally.

In the various mobile radio methods, the received field strength usually depends on the chosen carrier frequency. One reason for this is due to the frequency-dependent channel properties during signal transmission.

At the present time, signal amplifiers with a programmable gain, a so-called PGC, programmable gain control, are normally used in radio receivers for modulation methods which use a phase and amplitude shift keying.

In widespread mobile radio standards, such as GSM for example, which organize the data transmission in so-called time slots, the reception gain has hitherto been set in a manner dependent on an evaluation of the reception signal in the preceding time slot. The signal received in the current time slot is accordingly disadvantageously received with the optimum gain setting applicable to the preceding time slot.

However, some radio systems that operate with time slots use a frequency hopping method, that is to say that transmission is effected at a different frequency in each time slot according to a previously known pattern. On account of the frequency-dependent channel properties of the radio signal, however, this disadvantageously results in different received field strengths in each time slot.

Consequently, an algorithm for gain setting that operates as described and uses the signal amplitude of the preceding time slot as a basis for the gain setting makes an error, in principle. This error has to be compensated for by a higher dynamic range at the output of the amplifier and a larger bandwidth of the analog/digital (A/D) converter connected downstream.

One possibility for realizing a correction of a fluctuating received field strength in the radio receiver is automatic gain control, so-called AGC, as was used earlier in AM broadcast radio receivers. However, this would have the disadvantage that the amplitude information of the useful signal would be corrupted since the AGC corrects slow amplitude fluctuations that may be present in the useful signal.

The document DE 1 466 163 specifies an automatically tuned radio frequency circuit with an arrangement for automatic gain control. In this case, the intention is to automatically control the gain in a transmission channel without using mechanical devices. A binary-gradated attenuation device driven by a multistage binary register switch is shown for this purpose. The multistage binary register switch is driven by a multivibrator. A comparator connected between an amplifier connected downstream of the attenuation device and the multivibrator is furthermore provided.

SUMMARY

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

The present invention is directed to an amplifier assembly and a receiver comprising the amplifier assembly and also a method for operating a programmable amplifier in which amplitude fluctuations caused by frequency hopping methods are corrected.

In one embodiment of the invention an amplifier assembly comprises a programmable amplifier with a signal input, a signal output and a programming input for setting the gain. The assembly further comprises a comparator, which is connected to the signal output of the programmable amplifier, and configured to output a control signal at an output if the signal level at the signal output is greater than a predeterminable reference level. The assembly also comprises a counter with an incrementing input for incrementing the count, which is connected to the output of the comparator, and with a count output connected to the programming input of the amplifier for programming the amplifier.

In accordance with the present invention, the amplifier is configured as a programmable amplifier with a programming input for setting the gain factor. The comparator, which is connected to the output of the programmable amplifier, repeatedly compares the output level at the signal output of the amplifier with a reference level and outputs a control signal representing this comparison result. By means of a counter, which is preferably driven by a clock signal, the count is incremented step by step in a manner dependent on the control signal output by the comparator. In this case, the programming of the amplifier, that is to say the setting of the gain, is effected in a manner dependent on the current count provided by the counter at a count output.

The regulation of the programming of the gain value can advantageously be effected very rapidly in accordance with one embodiment of the invention, for example during the first one or two data bits within a time slot.

The tracking of the amplifier in a manner dependent on the current received field strength of a signal or generally on the signal level of a signal to be amplified affords the advantage that the gain control is no longer effected in a manner dependent on the signal conditions in the preceding time slot, rather the signal conditions in the current time slot are taken into account. Consequently, even when using frequency hopping methods, a constant signal level results at the amplifier output. This in turn enables reliable demodulation of a signal subjected to phase and amplitude shift keying.

In one exemplary embodiment of the present invention, the counter has a reset input for resetting the count. In one example, the count is reset before the beginning of a time slot for transmission of a useful signal.

In accordance with another embodiment of the invention, the largest programmable gain is set at the programmable amplifier with the counter reset.

Accordingly, in this example, at the start of a time slot, firstly the gain is set to the largest value that can be set. When the reception signal arrives, the output of the amplifier will initially be overdriven. Afterward, the gain value is reduced very rapidly by means of the control loop described at the programmable amplifier until the output signal level no longer exceeds the reference level. In this case, the reduction of the gain, which corresponds to the incrementing of the counter, is effected step by step or recursively.

Consequently, the gain factor is already reduced at the beginning of the time slot to such an extent that the receiver can correctly receive the signal. In this case, the gain value determined in this case is maintained for the entire time slot. A so-called peak-hold functionality is thereby implemented.

The fact that a few bits of useful information may be lost at the beginning of a time slot before the correct gain value is found is normally unproblematic in so far as it is normally the case anyway that firstly synchronization data, training sequences or the like, but no useful data in the actual sense, are communicated at the beginning of time slots.

With regard to the receiver, a receiver comprising an amplifier assembly as described above is provided. The receiver comprises a programmable amplifier, which is connected by its signal input, via a frequency down converter, to a means for coupling in a modulated signal and which is connected by its signal output to a demodulator for demodulating the modulated signal.

As already explained, the present invention is manifested particularly advantageously when the amplifier is employed in the reception signal processing chain of a radio receiver. In particular, the programmable amplifier described can advantageously be employed in those receivers which operate with a modulation with amplitude and phase variation and additionally organize the signal transmission in time slots and use frequency hopping methods.

With regard to the method, the invention comprises programming a largest settable gain of the programmable amplifier, and applying an input signal to the programmable amplifier and comparing the output level of the programmable amplifier with a reference level. The method further comprises reducing in a step-by-step fashion the gain of the programmable amplifier until the output level of the programmable amplifier no longer lies above the reference level.

In this case, firstly the maximum gain of the amplifier is set. If the amplified signal exceeds a reference level at the level detector, that is to say at a comparator, the gain is reduced in a step by step manner. The gain is reduced for as long as the output level with reduced gain is still greater than the reference level. This ends as soon as the output level of the amplifier no longer lies above the reference level. The gain then remains constant. A peak-hold functionality is thus implemented.

The clock rate of the step-by-step reduction of the gain may be significantly faster than the useful data rate since the control loop described does not have any slow filters. Consequently, the control loop may be set to the correct level within a few bits at the beginning of the time slot. Reliable and precise demodulation of a signal subjected to amplitude and phase shift keying is thus possible even in the case of a received field strength that fluctuates due to frequency hopping methods.

The driving of the programmable amplifier and the programming thereof in the control loop are preferably effected by means of a counter, the count of which is incremented step by step until the output level of the programmable amplifier no longer lies above the reference level. In this case, an incrementing of the counter brings about a reduction of the gain.

In one embodiment, the gain of the programmable amplifier is reduced still further step by step until the output level of the programmable amplifier no longer lies above the reference level including an overdriving margin for further signal processing. Such further signal processing may occur, for example, in an analog/digital conversion with subsequent, digital demodulation.

The programmable amplifier is configured, in one example, such that it is programmable in a dB-linear gradation.

The programmable amplifier is preferably designed such that it is programmable in constant dB steps, that is to say dB steps of identical magnitude.

It is evident that, in accordance with the principle proposed, it is advantageously possible to use such analog/digital converters whose dynamic range need not be significantly larger than the dynamic scope of the amplitude modulation of the signal. Consequently, the A/D conversion can be effected with a significantly lower outlay in conjunction with an improved accuracy and resolution.

Instead of the programming of the largest settable gain value with subsequent step-by-step reduction of the gain, it is also possible to use other methods, for example approximation methods.

Thus, by way of example, the gain value sought may also preferably be determined by firstly programming an arbitrary gain value that can be set. Afterward, an input signal is applied to the programmable amplifier. The output level of the amplifier is compared with a reference level. The gain value is then altered in accordance with the method of successive approximation until the output level of the programmable amplifier no longer lies above the reference level.

Instead of successive approximation, it is also possible to use an interval interleaving method or some other suitable method.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The detailed description is described with reference to the accompanying figures. In the figures, the left-most digit(s) of a reference number identifies the figure in which the reference number first appears. The use of the same reference number in different instances in the description and the figures may indicate similar or identical items.

FIG. 1 is a block diagram illustrating an exemplary receiver with an amplifier assembly in accordance with one embodiment of the invention.

FIG. 2 is a graph illustrating a profile of the output power over time in the case of an exemplary time slot for processing by the circuit in accordance with the invention of FIG. 1.

DETAILED DESCRIPTION

FIG. 1 shows a block diagram of a radio receiver with a heterodyne receiver architecture. A radio frequency, modulated signal is coupled in via an antenna 1 and amplified by means of a preamplifier 2 connected downstream of the antenna 1. Connected downstream of the preamplifier 2 is a frequency down converter 3, which is designed as a frequency mixer and mixes the radio frequency, modulated signal with a local oscillator or heterodyne signal LO. For this purpose, the frequency converter 3 has a first input, which is connected to the output of the preamplifier 2, and a second input, which is designed for connection to a carrier frequency generator that generates the carrier signal LO. A multistage, programmable amplifier 5 is connected to the output of the mixer 3 via a channel or intermediate frequency filter designed as a bandpass filter 4. The programmable amplifier 5, a so-called programmable gain amplifier, PGA, comprises four amplifier stages each having a control input. The control inputs of the amplifier stages are combined to form a programming input 6 of the multistage amplifier.

The output terminal of the programmable amplifier 5 is connected to the input of a demodulator 7, which is designed for demodulation of the modulated signal which is mixed to an intermediate frequency level by means of the mixer 3, subjected to bandpass filtering and amplified. Furthermore, a comparator 8 is connected to the output of the programmable amplifier 5. The comparator 8 has a further input for feeding in a reference level REF. The output of the comparator 8 is connected to an activation input 9 of a counter 10. The counter 10 furthermore comprises a clock input 11 and a reset input 12, which are designed for feeding in a clock signal CLK and a reset signal R, respectively. The counter 10 additionally has a count output connected to the programming input 6 of the amplifier 5.

At the beginning of a reception time slot in a received useful signal of the receiver in accordance with FIG. 1, the largest possible gain is programmed at the programmable amplifier 5. For this purpose, the counter 10 is reset at the reset input 12 before the time slot even begins. From the beginning of the time slot, the gain factor of the amplifier 5 is regulated downward step by step, in a manner dependent on a clock signal CLK. For this purpose, in each step, the comparator 8 compares the output level OUT at the amplifier 5 with the reference level REF. As long as the output level OUT still lies above the reference level REF, the count is incremented in each clock cycle of the clock signal CLK. The gain factor in the amplifier 5 is reduced each time the count is incremented. In this case, the gain factor is reduced in constant dB steps, for example by −1 dB per incrementing of the count. The output level OUT is thus reduced by means of the described regulation of the amplifier until the output level OUT no longer lies above the reference level REF. This setting of the amplifier 5 is effected within the first bits of a time slot of the useful signal, during which no amplitude shift keying is as yet effected. The gain value remains programmed for the entire running duration of the time slot, so that a peak-hold functionality is implemented.

In accordance with one embodiment of the invention, the gain of the receiver is set such that the signal amplitude of the signal in the current time slot is used instead of the amplitude in the previous time slot. In this case, the amplitude information that is part of the modulation data is amplified in an uncorrupted manner during the time slot.

The reference level is chosen such that an A/D converter connected downstream of the programmable amplifier 5 in the demodulator 7 can digitize the amplified useful signal, enlarged by a definable overdriving margin, without distortions. By virtue of the fact that the gain is firstly set to its maximum at the beginning of the time slot, amplitude information can be lost at the beginning of the time slot, without any disadvantage, until the correct gain setting has been found. However, since the assembly of the present invention is not provided with any filters with a long signal propagation time in the control loop, the gain setting is advantageously effected very rapidly.

The comparator 8 may also be embodied as a so-called level detector.

The increment input 9 of the counter remains active for as long as the output level OUT with reduced gain is still greater than the reference level REF.

In one example, the counter clock is significantly faster than the useful data rate since, as already explained, no slow filters are provided in the control loop 5, 8, 10. Consequently, the control loop 5, 8, 10 can be set to the correct reception level within a few bits at the beginning of the time slot.

The receiver described can be employed particularly advantageously for future Bluetooth specifications since the latter envisage permitting, at the beginning of each time slot, firstly a data transmission to take place as in the Bluetooth standard in version 1.1 with GFSK, which does not have amplitude information. Instead, transmission is firstly effected with a maximum possible output power. It is only in a subsequent useful data block that amplitude information is also communicated in addition to phase information. However, if no amplitude information is communicated anyway at the beginning of a time slot, loosing it is not troublesome either.

FIG. 2 is a graph illustrating a profile of the output power over time in the case of a time slot envisaged in a future version of a Bluetooth specification. In this case, firstly a so-called access code corresponding to the specifications of the Bluetooth standard 1.1 is communicated. This uses Gaussian frequency shift keying and thus carries no amplitude information. After a so-called guard block and a synchronization block, useful data that are phase- and amplitude-modulated, for example, in a quadrature amplitude modulation, are transmitted for the rest of the time slot. Consequently, the entire time duration of the access code can be used to program the amplifier 5, as shown in FIG. 1, with regard to its gain value.

However, the present invention is not just suitable for Bluetooth applications. Rather, it is customary in almost all digital radio transmission systems to transmit training sequences, synchronization data etc. at the beginning of a time slot, but no useful data at the beginning. Overall, the present invention can be applied to all radio systems in which the amplitude information of the first two to three bits of a time slot can be dispensed with.

If, moreover, as is customary anyway, the transmitter is switched on before the first bits of the time slot are actually communicated, not even the first two to three bits will be lost.

The present invention is advantageously applied to frequency hopping methods, in particular, since the received field strength and thus also the amplitude conditions of the useful signal are influenced by the frequency-dependent properties of the transmission channel.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. A receiver, comprising:
    a mixer configured to down-convert a radio frequency modulated signal to an intermediate frequency modulated signal;
    a programmable gain amplifier configured to receive and amplify the intermediate frequency modulated signal based on a programmable gain value associated therewith;
    a demodulator configured to receive and demodulate the amplified intermediate frequency modulated signal; and
    a control circuit configured to produce a gain programming control signal for dictating a gain of the programmable gain amplifier based on a level of the amplified intermediate frequency modulated signal at a beginning portion of a time slot, wherein the control circuit is configured to reset the gain of the programmable gain amplifier via the gain programming control signal to a maximum gain setting associated therewith at a beginning of the time slot, and incrementally decrease the gain of the programmable amplifier until the level of the amplified intermediate frequency modulated signal is less than a predetermined threshold value, and wherein the control circuit is further configured to maintain the gain of the programmable amplifier via the gain programming control signal at that level for a remaining portion of the time slot.

2. The receiver of claim 1, wherein the time slot corresponds to a Bluetooth communication specification, and wherein the beginning of the time slot corresponds to a time period allocated to an access code portion of the time slot, and wherein the gain is subsequently maintained during a time period of the time slot associated with a transfer of useful data.

3. The receiver of claim 1, wherein the beginning of the time slot corresponds to a time period allocated for transmission of a training sequence or synchronization data.

4. The receiver of claim 1, wherein the control circuit comprises:
    a comparator circuit configured to compare the amplified intermediate frequency modulated signal to a reference value corresponding to the predetermined threshold value, and generate a count control signal in response thereto; and
    a counter configured to increment or decrement in a step-by-step fashion the gain programming control signal based on a state of the count control signal.

5. The receiver of claim 4, wherein the comparator circuit is configured to force the count control signal to a counter enable state when the amplified intermediate frequency modulated signal is greater than the reference value, and force the count control signal to a counter disable or hold state when the amplified intermediate frequency modulated signal is less than the reference value.

6. The receiver of claim 4, wherein the counter further comprises a clock input, and is configured to increment or decrement the gain programming control signal at a rate associated with a frequency of a clock signal provided at the clock input.

7. The receiver of claim 4, wherein the counter further comprises a reset input configured to receive a signal indicative of an initiation of a time slot, and wherein the signal is configured to reset the counter, thereby resetting the gain programming control signal to a value indicative of a maximum gain value of the programmable amplifier when the signal at the reset input indicates a beginning of a time slot.

* * * * *

UNITED STATES PATENT AND TRADEMARK OFFICE
CERTIFICATE OF CORRECTION

PATENT NO. : 7,894,785 B2  Page 1 of 1
APPLICATION NO. : 12/777721
DATED : February 22, 2011
INVENTOR(S) : Elmar Wagner It is certified that error appears in the above-identified patent and that said Letters Patent is hereby corrected as shown below:

On the Title Page:
Item (63), please delete the incorrect Related U.S. Application Data:

"Continuation of application No. 11/132,517, filed on May 19, 2005, now Pat. No. 7,734,267, which is a continuation of application No. PCT/DE03/03895, filed on Nov. 25, 2003."

With the correct Related U.S. Application Data:

--Divisional of application No. 11/132,517, filed on May 19, 2005, now Pat. No. 7,734,267, which is a continuation of application No. PCT/DE03/03895, filed on Nov. 25, 2003.--

Signed and Sealed this
Twenty-first Day of June, 2011

David J. Kappos
*Director of the United States Patent and Trademark Office*